United States Patent
Shin

(10) Patent No.: US 12,419,019 B2
(45) Date of Patent: Sep. 16, 2025

(54) DISPLAY APPARATUS AND METHOD OF ANTISTATIC COATING

(71) Applicant: LG DISPLAY CO., LTD., Seoul (KR)

(72) Inventor: Insik Shin, Paju-si (KR)

(73) Assignee: LG Display Co., Ltd. (KR)

( * ) Notice: Subject to any disclaimer, the term of this patent is extended or adjusted under 35 U.S.C. 154(b) by 115 days.

(21) Appl. No.: 17/990,772

(22) Filed: Nov. 21, 2022

(65) Prior Publication Data

US 2023/0209793 A1    Jun. 29, 2023

(51) Int. Cl.
*H05K 5/03*    (2006.01)
*H05K 9/00*    (2006.01)

(52) U.S. Cl.
CPC ............. *H05K 9/0079* (2013.01); *H05K 5/03* (2013.01); *H05K 9/0067* (2013.01)

(58) Field of Classification Search
CPC ... H05F 1/02; G09G 3/34; H05K 9/00; H05K 5/03; H05K 9/0079; H05K 9/0067; G06F 1/1637; G02F 1/133331; G09F 9/335
USPC .................................................. 361/212, 220
See application file for complete search history.

(56) References Cited

U.S. PATENT DOCUMENTS

| | | | |
|---|---|---|---|
| 2018/0017715 A1* | 1/2018 | Matsuda | H01B 5/14 |
| 2020/0194710 A1 | 6/2020 | Zhao et al. | |
| 2021/0151216 A1* | 5/2021 | Yang | H05K 1/097 |
| 2022/0310979 A1* | 9/2022 | Li | H10K 50/868 |
| 2023/0079135 A1* | 3/2023 | Park | H04M 1/0214 |
| | | | 361/679.27 |

FOREIGN PATENT DOCUMENTS

| | | |
|---|---|---|
| CN | 107210091 A | 9/2017 |
| CN | 112909069 A | 6/2021 |
| KR | 10-2008-0074622 A | 8/2008 |
| KR | 20140055351 A | 5/2014 |
| KR | 20210081953 A | 7/2021 |
| KR | 20210086029 A | 7/2021 |
| WO | WO 2021/251628 A1 | 12/2021 |

OTHER PUBLICATIONS

Office Action in Korean Appln. No. 20210191442, mailed on Nov. 13, 2024, 16 pages (with English translation).
Office Action in Chinese Appln. No. 202211355752.0, mailed on May 30, 2025, 14 pages (with English translation).

* cited by examiner

*Primary Examiner* — Danny Nguyen
(74) *Attorney, Agent, or Firm* — Fish & Richardson P.C.

(57) ABSTRACT

A display apparatus includes an antistatic coating disposed sequentially on the cover member, the display panel and the cushion plate, wherein the antistatic coating is configured to include a plurality of rod-shaped nanowires, thereby improving conductivity of the antistatic coating and effectively reducing a brightening phenomenon where light emission gets brighter at an end or on a side than other areas of the display panel.

15 Claims, 10 Drawing Sheets

DISPLAY APPARATUS AND METHOD OF ANTISTATIC COATING

CROSS-REFERENCE TO RELATED APPLICATION

The present application claims the priority of Korean Patent Application No. 10-2021-0191442, filed on Dec. 29, 2021, which is hereby incorporated by reference in its entirety.

BACKGROUND

Field of the Disclosure

The present disclosure relates to a display apparatus, and particularly to a display apparatus capable of improving a brightening phenomenon where an area at an end of a display panel gets brighter than other areas of the display panel and a greenish phenomenon where an area at an end of a display panel gets greener.

Description of the Background

Display apparatus that display images in televisions, monitors, smartphones, tablet PCs, laptops and the like utilize various methods and take various forms.

Among the display apparatus utilizing various methods, liquid crystal display (LCD) has been used up until now, and the scope of use and application of organic light emitting display (OLED) is rapidly expanding.

Since a display apparatus includes a display panel having a plurality of light-emitting elements or a liquid crystal to implement images, and a driving transistor to control each light-emitting element or to operate a liquid crystal, the display apparatus employs a plurality of light-emitting elements or a liquid crystal to display images as intended.

Among such apparatus, the liquid crystal display apparatus does not implement a self-light emitting method and thus, the liquid crystal display apparatus requires a light source such as a backlight that emits light from a rear surface. The backlight increases thickness of the liquid crystal display apparatus, and causes restrictions in implementing the apparatus to take various types of designs such as a bendable design.

Since an organic light emitting display apparatus having self-light emitting elements can be made thinner than the display apparatus equipped with a light source, and does not require a separate light source, the organic light emitting display apparatus can be implemented to take various designs such as a bendable design.

The light-emitting elements of the organic light emitting display apparatus is driven by applying voltage or current to a circuit configured with a plurality of transistors, capacitors and the like.

Since a display panel includes a plurality of transistors, capacitors and the like, the display panel may operate abnormally if electric charges occurred from outside of the display panel are introduced to the display panel.

The display apparatus may include a cover member made of glass or plastic in order to protect the display panel from external shocks. However, if the electric charges generated by friction between a cover member and an external subject, or the electric charges generated from outside pile up in the cover member, a high electric field may be formed in proportion to the quantity of piled electric charges.

The electric charges piled up in the cover member and at sides of the display panel may transfer to the display panel, and a strong electric field may be formed at sides of the display panel. By the electric charges or the electric fields, a threshold voltage of thin film transistors arranged at side areas of the display panel may be shifted.

If the threshold voltage of the thin film transistors is shifted to be higher, the display panel may emit light by a voltage higher than before and a brightening phenomenon where an area at an end or a side area of a display panel gets brighter than other areas, or a Greenish phenomenon where an area at an end of a display panel emit light in bright green may occur and the display quality may deteriorate.

In addition, if the threshold voltage gets lower due to the threshold voltage shift, the threshold voltage of thin film transistors disposed at side areas of the display panel gets lower. In such case, the display panel may emit light by a signal lower than a light emitting signal.

Therefore, since the end or the side area of the display panel may emit light even though the light emitting signal is not applied, the side area may emit light unintentionally or the Greenish phenomenon may occur and the display quality may deteriorate.

The above information disclosed in this Background section is only for enhancement of understanding of the background of the described technology and therefore it may contain information that does not form prior art that is already known to a person of ordinary skill in the art.

SUMMARY

Accordingly, the present disclosure is to provide a display apparatus capable of improving the brightening phenomenon where light emission gets brighter at an end of the display panel, or the greenish phenomenon.

Various aspect of the present disclosure are not limited to what are mentioned hereinabove, and other effects not mentioned can be clearly understood by those skilled in the art from the following description.

One aspect is a display apparatus including a display panel configured to display images; a cover member configured to be disposed upon the display panel and protect the display panel from external shocks, a cushion plate configured to be disposed below the display panel and have features of cushioning and heat dissipation, and an antistatic coating configured to extend and disposed from the cover member to the cushion plate, and the antistatic coating comprises a plurality of nanowires.

A method of disposing the antistatic solution according to the aspects of the present disclosure may include forming the antistatic solution by mixing the nanowires with at least one or more solvents among acetone, water, isopropyl alcohol and ethanol, applying the antistatic solution in the display apparatus and drying the antistatic solution.

Details regarding other aspects are included in the detailed description and accompanying drawings.

According to the aspects of the present disclosure, the antistatic coating is disposed sequentially on the cover member, the display panel and the cushion plate. Since the antistatic coating may include a plurality of nanowires, it is possible to transfer and disperse the electric charges or the electric fields piled up in the cover member and the display panel effectively to the cushion plate.

Therefore, the greenish phenomenon or the brightening phenomenon where light emission gets brighter at an end of a display panel may be reduced.

In addition, since a horizontal line pattern or a diagonal line pattern are formed in a heat dissipation layer of the cushion plate, and a plurality of nanowires can be arranged effectively.

Advantageous Effects of the present disclosure are not limited to what are mentioned hereinabove, and other effects not mentioned can be clearly understood by those skilled in the art from the following description.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1A:
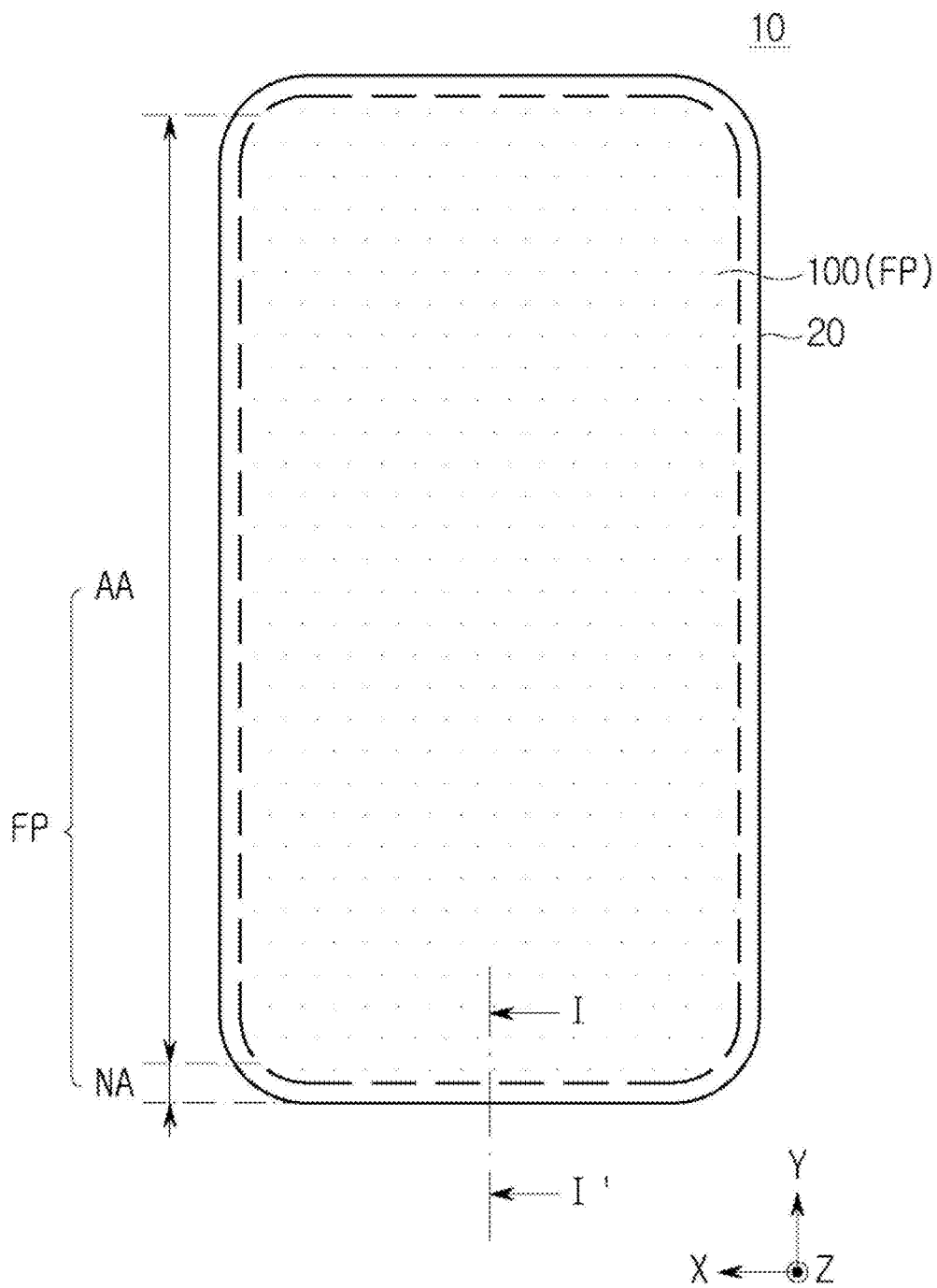
FIG. 1A is a plan view illustrating a front surface of a display apparatus according to an aspect of the present disclosure.

Details to demonstrate the present disclosure will be more clearly understood from the following detailed description with accompanying drawings. However, the present disclosure is not limited to the aspects disclosed hereinafter and can be implemented in various different forms. These aspects are provided so that the present disclosure can be thorough and complete, and can fully convey the scope of the present disclosure to a person skilled in the art, and the claims are not limited by aspects of the present disclosure.

It is to be understood that the present disclosure is not limited to accompanying drawings since shapes, sizes, ratio, angle, counts and the like are taken merely as examples to explain aspects. Like reference numerals denote like elements throughout the disclosure. In addition, in describing the present disclosure, if a description of a related known art in detail is deemed to unnecessarily obscure the substance of the present disclosure, description of such art will be omitted. When terms, 'comprise', 'have' and 'be achieved' and the like, are used in the present disclosure, other features not mentioned therein may be added unless the terms are used with the term 'only'. The singular forms expressed herein are intended to include the plural forms as well, unless the context expressly indicates otherwise.

Components are interpreted to include an error range unless otherwise expressly stated.

In case of describing positions, for example, when describing position relation between two parts with terms such as 'in', 'upon', 'below', 'next' and the like, one or more intervening parts may be disposed between the two parts, unless the terms are used with terms 'immediately' or 'directly'.

When an element or layer is disposed 'on' the other element or layer, another element or layer may be disposed directly on the other element or layer or therebetween.

Though terms such as 'a first', or 'a second' are used to describe various components, these components are not confined by these terms. These terms are merely used to distinguish one component from the other component. Therefore, a first component being mentioned in the description below may be a second component in a technical concept of the present disclosure Like reference numerals denote like elements throughout the disclosure.

Sizes and thicknesses in the accompanying drawings are chosen for convenience of describing the specification; thus, the present disclosure is not limited by the illustrated sizes and thicknesses of the drawings.

The features of various aspects of the present disclosure can be partially or entirely connected or combined with each other and can be interlocked and operated in technically various ways as will be fully understood by those skilled in the art, and the aspects can be carried out independently of or in association with each other.

The display apparatus of the present disclosure may be applied to an organic light emitting display apparatus, but is not limited thereto, and may be applied to various display apparatus such as LED display apparatus or Quantum Dot display apparatus.

Hereinafter, a display apparatus according to aspects of the present disclosure will be described in detail with reference to accompanying drawings.

FIG. 1A is a plan view illustrating a front surface of a display apparatus according to an aspect of the present disclosure.

With reference to FIG. 1A, a cover member 20, a display panel 100 and a front of a display panel 100 where an active area (AA) and a non-active area (NA) positioned in a display apparatus 10 are illustrated.

Figure 1B:
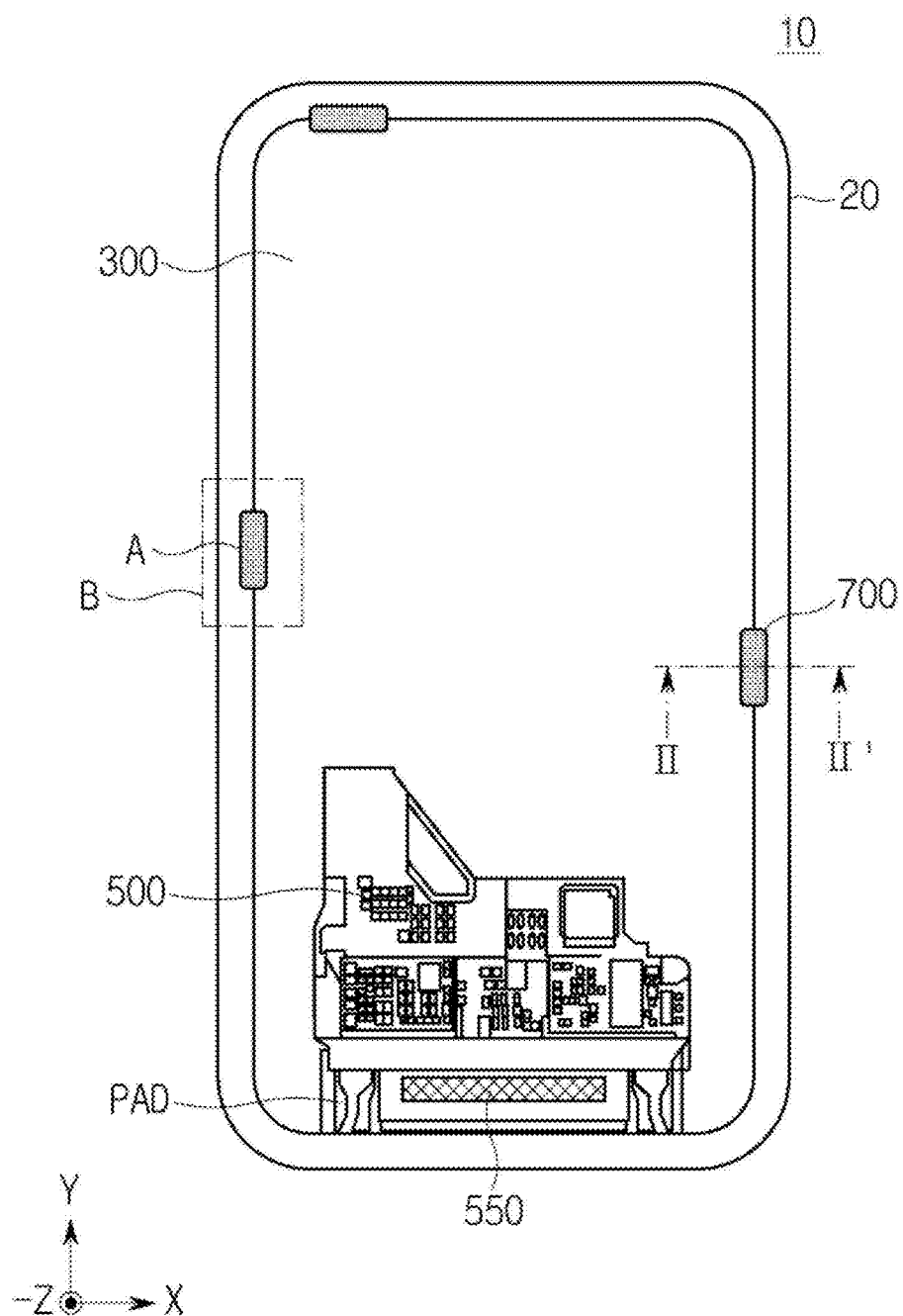
FIG. 1B is a plan view illustrating a rear surface of a display apparatus where the antistatic coating is applied according to an aspect of the present disclosure.

FIG. 1B is a plan view illustrating a rear surface of a display apparatus where the antistatic coating is applied according to an aspect of the present disclosure.

With reference to FIG. 1B, a rear surface of a display apparatus 10 that includes a cushion plate 300, a pad part (PAD) of a display panel 100, a flexible printed circuit board 500 and a driver 550 is illustrated.

With reference to FIG. 1A and FIG. 1B, the display apparatus 10 may include a cover member 20 and a display panel 100 attached below (−Z direction) the cover member 20. The display apparatus 10 may include a first plate, a cushion plate 300, a second plate and the like disposed below the front part (FP) of the display panel 100.

The cover member 20 is disposed to cover the front surface of the display panel 100 so that it can protect the display panel 100 from external shocks. The cover member 20 may be formed of a cover glass, a tempered glass, a reinforced plastic and the like, and is not limited thereto.

Edges of the cover member 20 may have a curved surface or a curvature surface being curved in a rear direction (-Z direction) of the display apparatus.

The cover member 20 may be disposed to cover side areas of the display panel 100 positioned below the cover member 20, therefore, the side areas as well as the front of the display panel 100 may be protected from external shocks.

The cover member 20 may be formed of a transparent material so that it can overlap with an area displaying images. For example, the cover member 20 may be formed of a transparent plastic or a cover glass made of a transparent glass that may transmit images, but is not limited thereto.

Below the cover member 20, the display panel 100, more specifically, a front part (FP) of the display panel 100 may be disposed. In the front part (FP), a pixel array unit that includes a plurality of light emitting elements, pixels having a thin film transistor and a wiring of signals transmitting driving signal are disposed to display images. The front part (FP) may include an active area (AA) where images are displayed and a non-active area (NA) that is off the active area (AA). The non-active area (NA) may be formed at edges encompassing the active area (AA).

In the cover member 20, an area where images are transmitted may be the active area (AA) and an area that encompasses the active area (AA) and where images cannot be transmitted may be the non-active area (NA). The non-active area (NA) may refer to a bezel area.

The display panel 100 disposed below the cover member 20 may include a bending part extended and being bent from a side of the front part, and a pad part (PAD) extended from the bending part and disposed below the front part (FP). In the pad part (PAD), a flexible printed circuit board 500 where a driver 550 to drive pixels is mounted may be disposed. Or a driver 550 may be directly connected in the pad part (PAD).

In the cover member 20 and the cushion plate 300, an antistatic coating 700 may be disposed. Specifically, the antistatic coating 700 may be sequentially disposed on a rear surface of the cover member 20 and a side and a rear surface of the cushion plate 300. The side of the cushion plate 300 may refer to a side surface and the side area of the cushion plate may refer to some end portions on a side surface, a top surface and a lower portion.

The antistatic coating 700 may serve to transfer the electric charges and the electric fields occurring on a side surface of the cover member 20 and the display panel 100 to the rear surface of the cushion plate 300. The electric charges and the electric fields transferred to the cushion plate 300 may be dispersed over the entire area of the cushion plate, and then be removed.

The maximum effect of the antistatic coating 700 may be achieved if the antistatic coating 700 is formed in whole areas along edges of the display apparatus 10 at a rear surface of the cover member 20 and a side surface and a rear surface of the cushion plate 300. However, below the display apparatus 10, an additional component such as a set frame, a middle frame, an antenna and the like may be disposed. Therefore, considering disposition with other components, the antistatic coating 700 may be formed at a portion of an upper portion, a left portion and a right portion of the display apparatus 10.

At a lower portion of the display apparatus 10 where the pad part (PAD) is disposed, the antistatic coating 700 may be omitted. Regarding the lower portion of the display apparatus 10, since the pad part (PAD) or flexible printed circuit board 500 is disposed below the cushion plate 300, it is structurally difficult to form the antistatic coating 700 that connects a rear surface of the cover member 20 and the cushion plate 300.

Further, four sides of the display panel 100 are cut during a trimming process, and electric charges on the sides which are cut by the trimming process get activated. The activated electric charges pile up together with the electric charges occurred in the cover member 20. Therefore, the brightening phenomenon that light emits more brightly around the cut sides of the display panel 100 and the Greenish phenomenon may increase.

However, in the pad part (PAD) disposed below the display panel 100, a thin film transistor is not formed, and since a gap between the cut side of the pad part (PAD) and the thin film transistor of the active area (AA) is largely formed, influence by the trimming may be little. Therefore, the antistatic coating 700 may be omitted in the lower portion of the display panel 100.

By coating the end of the cushion plate 300 (See FIG. 2) or the first plate 210 (See FIG. 2) with the antistatic solution through a dispenser and drying the coating, the antistatic coating 700 may be formed.

The antistatic solution may be coated in a dotting manner, at three portions that are the upper portion, the right portion and the left portion, which fall within edges of the display apparatus 10 and where no pad part (PAD) is positioned. The antistatic solution may be naturally dried and then form the antistatic coating 700.

Regarding the antistatic solution to form the antistatic coating 700, since it is difficult to control flowing of the antistatic solution, there may be some areas where the coating is cut off in the middle if a moderate amount is applied.

Therefore, the antistatic solution may include a solvent that includes at least one or more materials among acetone, water, isopropyl alcohol and ethanol to ensure to form the coating without having a cut-off in the middle, and may include a plurality of nanowires to improve conductivity.

A plurality of nanowires connected from a rear surface of the cushion plate 300 to a rear surface of the cover member 20 may transfer the electric charges and the electric fields.

The antistatic solution may include a plurality of conductive balls, and may dispose the conductive balls sequentially from a rear surface of the cushion plate 300 to a rear surface of the cover member 20. Since the nanowires are rod-shaped and are formed to be longer than the conductive balls that are circular-shaped, connection between the nanowires is easier, thus the nanowires may be connected from the cover member 20 to the cushion plate 300 without any cut-off spot in the middle.

Figure 3:
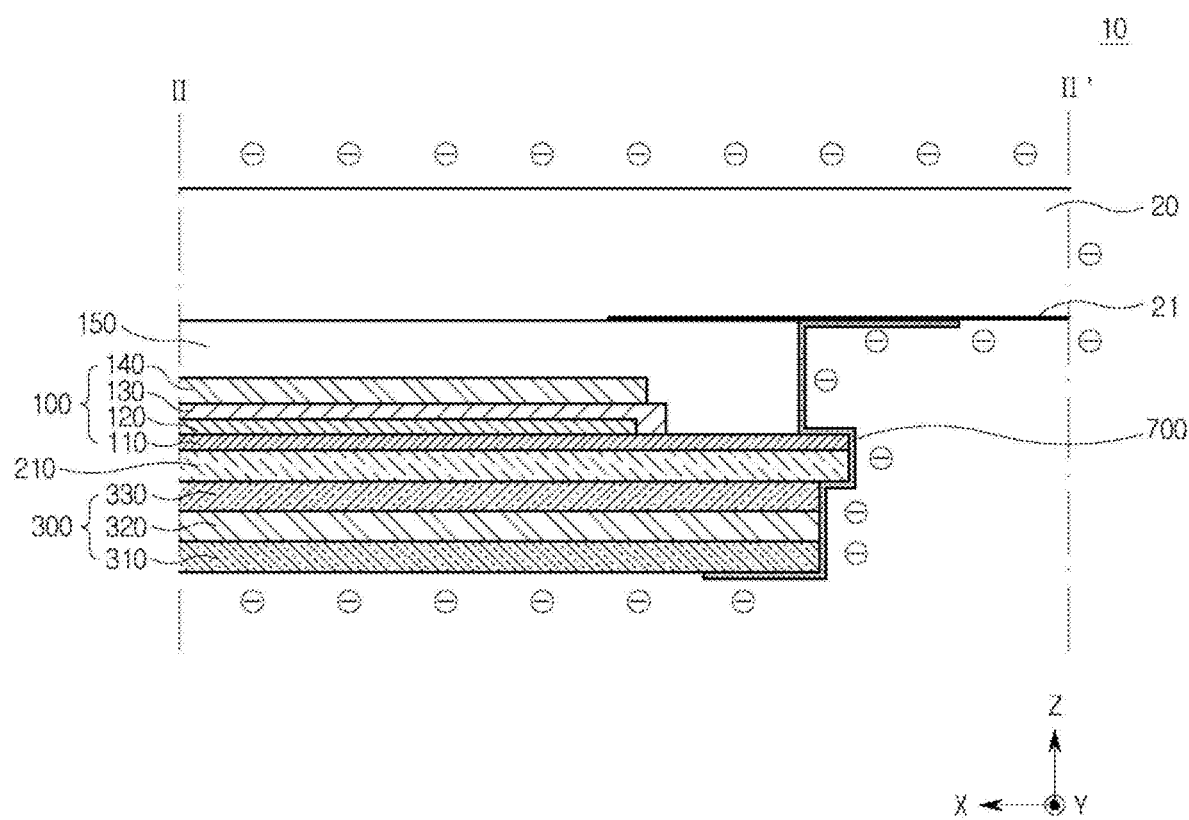
FIG. 3 is a sectional view taken along line II-II' of FIG. 1B.

The electric charges or electric fields being formed at sides of the cover member 20 and the display panel 100 may be transferred along the antistatic coating 700 to a heat dissipation layer 310 and be dispersed (See FIG. 3).

In addition, if the antistatic coating 700 is electrically connected with a ground through a ground path, the electric charges of the cover member 20 may be discharged to the outside through the ground.

Figure 2:
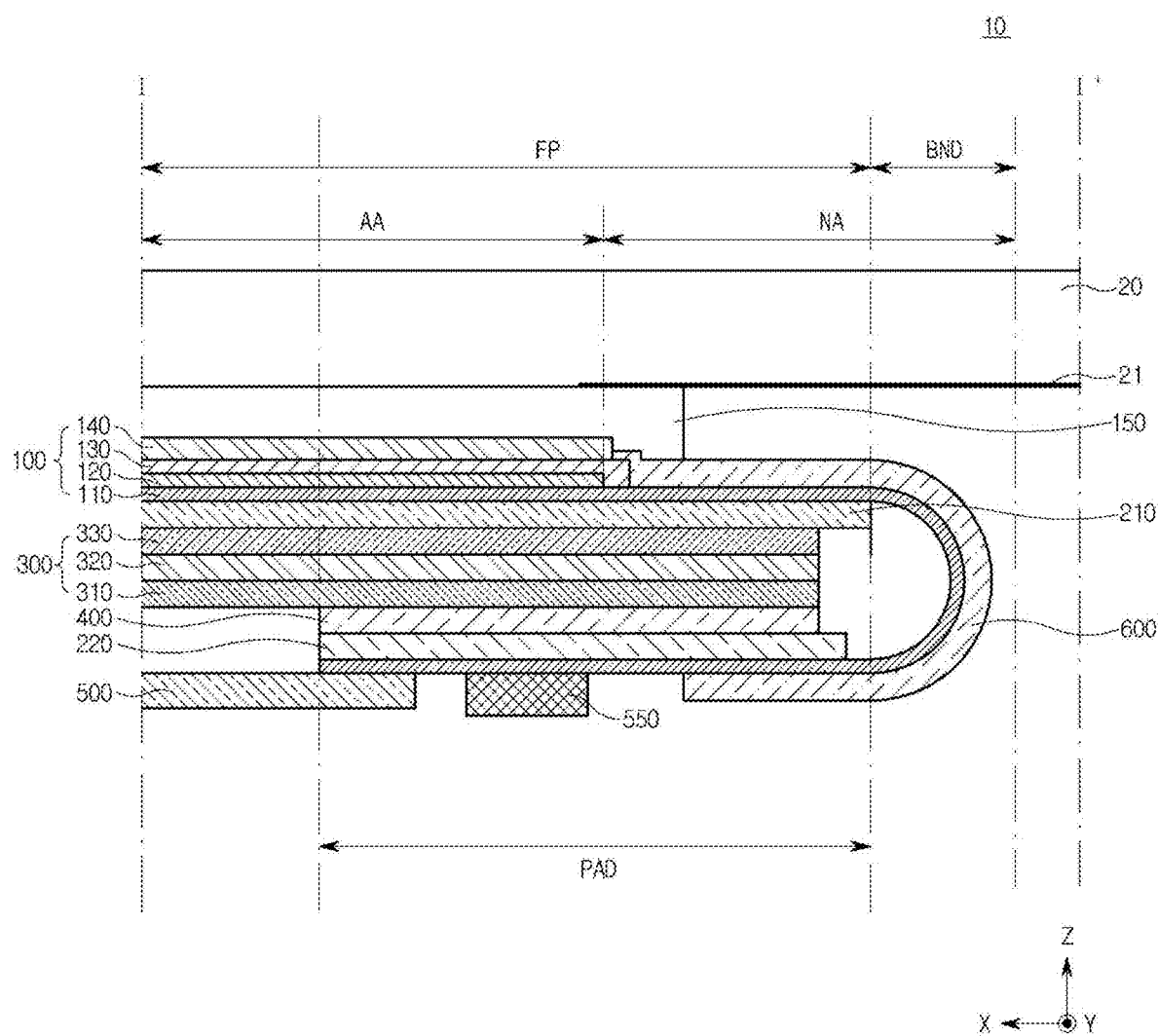
FIG. 2 is a sectional view taken along line I-I' of FIG. 1A.

FIG. 2 is a sectional view taken along line I-I' of FIG. 1A. Referring to the FIG. 2, FIG. 2 is a sectional view of a lower portion of the display apparatus 10 where the antistatic coating 700 is not disposed, and the overall configuration of the display apparatus 10 is illustrated.

Referring to the FIG. 2, the display apparatus 10 may include the cover member 20 disposed on a top surface and the display panel 100 disposed below the cover member 20.

Between the cover member 20 and the display panel 100, a first connecting member 150 may be disposed. The first connecting member 150 may connect or couple the cover member 20 and the display panel 100.

Since the first connecting member 150 may overlap with the active area (AA), a material that can transmit images of the display panel 100 may be used. For example, the first connecting member 150 may be formed of Optical Clear Adhesive (OCA), Optical Clear Resin (OCR), or Pressure Sensitive Adhesive (PSA) and the like, or a material which includes one among the above material, but is not limited thereto.

The cover member 20 may include a light blocking unit 21 disposed at edges of a rear surface of the cover member 20.

The light blocking unit 21 may prevent various circuits, wirings and structures disposed in the non-active area (NA) of the display panel 100 from being made visible to users.

The light blocking unit 21 may be disposed to correspond to at least the non-active area (NA) of the display panel 120. The light blocking unit 21 may be formed of a material capable of absorbing light. The light blocking unit 21 may be formed with a conductive material.

For example, the light blocking unit 21 may be formed of a black matrix, may be formed in a method of printing a conductive black ink, and is not limited thereto.

The display panel 100 disposed below the cover member 20 may include the front part (FP), the bending part (BND) and the pad part (PAD) based on a display substrate 110.

The front part (FP) of the display panel 100 may refer to an area disposed below the first connecting member 150. For example, the front part (FP) may be an area where images are displayed, and the display substrate 110, the pixel array unit 120, an encapsulation layer 130 and an optical plate 140 may be disposed in the front part.

The bending part (BND) of the display panel 100 may refer to a part that is extended from a side of the front part (FP) and is bent in an underneath direction (−Z direction), and then bent again in a plane direction (Y direction). In the bending part (BND), the display substrate 110 and the wiring of signals may be disposed.

The pad part (PAD) of the display panel 100 may refer to a part extended from the bending part (BND) and disposed below the front part (FP). In the pad part (PAD), display substrate 110, the wiring of signals, and a pad electrode being connected to the wiring of signals may be disposed. The flexible printed circuit board 500 or a driver 550 to drive pixels may be connected in the pad electrode.

An optical plate 140 may be disposed upon the front part (FP). And between the first connecting member 150 and the optical plate 140, a functional optical layer (not illustrated) may be further disposed to improve display performance of the display apparatus 10.

The optical plate 140 may improve outdoor visibility and contrast ratio of images being displayed in the display panel 100 by preventing reflection of the external light.

At the bottom of the display panel 100, the display substrate 110 may be disposed. The display substrate 110 may be disposed on the front part (FP), the bending part (BND), and the pad part (PAD). The display substrate 110 may be formed of a flexible plastic material and thus, it may have flexibility. The display substrate 110 may be formed by including polyimide, and may be formed of a thin flexible glass material.

The display substrate 110 is not limited thereto, and may be formed of a stiff glass material having a certain thickness.

In the display substrate 110, the pixel array unit 120 may be disposed. The pixel array unit 120 may display images. A part where the pixel array unit 120 is disposed may be the active area (AA). Therefore, based on the cover member 20, an area corresponding to the pixel array unit 120 may be the active area (AA) and the other remaining area other than the active area (AA) may be the non-active area (NA).

The pixel array unit 120 may include the light emitting elements, the thin film transistor to drive the light emitting elements, gate lines and data lines disposed in the display substrate 110, and the wiring of signals such as a power line to drive pixels.

The pixel array unit 120 may include pixels displaying images according to signals supplied to the wiring of signals, and the pixels may include the light emitting elements and the thin film transistor. The light emitting elements may include an anode electrode electrically connected with the thin film transistor, an emitter layer formed in the anode electrode, and a cathode electrode supplying a common voltage.

The thin film transistor may include a gate electrode, a semiconductor layer, a source electrode, a drain electrode and the like. The semiconductor layer of the thin film transistor may include a silicone such as an a-Si, a poly-Si, a low temperature poly-Si and the like or an oxide such as Indium-Gallium-Zinc-Oxide (IGZO), but is not limited thereto.

The anode electrode may be disposed in each pixel area to correspond to an opening area arranged depending on a pattern form of a pixel and may be electrically connected with the thin film transistor.

The light emitting elements may include an emitter layer formed between the anode electrode and the cathode electrode. The emitter layer may be implemented to emit light in the same color such as a white-light per pixel, or in a different color such as a red-light, green-light, or blue-light per pixel.

The encapsulation layer 130 may be disposed in the display substrate 110 to cover the pixel array unit 120. The encapsulation layer 130 may prevent oxygen, moisture or other foreign material from permeating into a light emitting elements layer of the pixel array unit 120. The encapsulation layer 130 may be formed in a stacked-layer structure where an organic material layer and an inorganic material layer are stacked alternately, but is not limited thereto.

In the front part (FP) of the display panel 100, the display substrate 110, the pixel array unit 120 and the encapsulation layer 130 may be disposed, and the front part (FP) may be formed to be flat except its edges. The first plate 210 may be connected or bonded with the front part (FP), in order to maintain the flat state and improve rigidity.

The bending part (BND) of the display panel 100 is a part where a user can easily bend the part in an intended direction and may be formed by including the display substrate 110 where the pixel array unit 120, the encapsulation layer 130 and the first plate 210 are not disposed, and the wiring of signals.

The pad part (PAD) of the display panel 100 may be an area where the pixel array unit 120 and the encapsulation layer 130 are not configured to be disposed. The pad part (PAD) may be connected or coupled with the second plate 220 so as to maintain the flat state and improve rigidity.

In other words, based on a form before the display panel 100 gets bent, the first plate 210 disposed at a lower portion of the front part (FP) of the display panel 100 and the second plate 220 disposed at a lower portion of the pad part (PAD) may be coupled at a lower portion of the display substrate 110 so as to reinforce rigidity of the display substrate 110 and maintain the flat state of the front part (FP).

The first plate 210 and the second plate 220 may be formed to have a certain rigidity and thickness so as to reinforce rigidity of the display substrate 110, and may not be formed in an area of the bending part (BND) where the bending part (BND) is positioned.

Based on the form before the display panel 100 gets bent, the first plate 210 and the second plate 220 may be disposed at a lower portion of the display substrate 110, and may be spaced apart from each other.

Based on a form after the display panel 100 gets bent, the first plate 210 is disposed below the front part (FP) and the second plate 220 is disposed at an upper portion of the pad part (PAD).

The first plate 210 and the second plate 220 may be backplates which are to be disposed at a rear surface of the display substrate 110. The first plate 210 and the second plate 220 may be formed of a thin film plastic having rigidity. For example, the first plate 210 and the second plate 220 may be formed of polyethyleneterephthalate (PET), polyimide (PI), polyethylene naphthalate (PEN) and the like, and are not limited thereto. The first plate 210 and the second plate 220 may be formed of a same material having same thickness, but are not limited thereto.

Based on the form after the display panel 100 gets bent, between the first plate 210 and the second plate 220, the cushion plate 300 may be disposed. The cushion plate 300 may be formed of a plurality of layers or a single layer having features of cushioning and heat dissipation, and is not limited by its term.

The cushion plate 300 may include one or more layers among the heat dissipation layer 310, a cushion layer 320 and an adhesive layer 330. For example, the cushion plate 300 may take a form where the adhesive layer 330, the cushion layer 320 and the heat dissipation layer 310 are sequentially stacked in an underneath direction (−Z direction).

The heat dissipation layer 310 may be disposed to correspond to a component generating high temperature, and may include a material having high thermal conductivity. Heat being generated in a driver 550 or the display panel 100 may be dissipated by the heat dissipation layer 310.

For example, the heat dissipation layer 310 may include a metal having high thermal conductivity such as copper (Cu) and aluminum (Al), or graphite but is not limited thereto. In addition, the heat dissipation layer 310 has conductivity and accordingly, may have a feature to discharge static electricity, a feature to be grounded and a feature to protect a rear surface of the display substrate 110 along with a feature of heat dissipation.

Between the heat dissipation layer 310 and the cushion layer 320, the anti-lifting layer (not illustrated) may be additionally disposed. The anti-lifting layer may be formed of a flexible material such as a polyimide film, and may be disposed to prevent the cushion plate 300 from being lifted when sides of the cover member 20 get bent.

The cushion layer 320 may be disposed on the heat dissipation layer 310, and may include a material having a cushion such as a foam tape or a foam pad, and the like. The cushion layer 320 may absorb shocks given to various parts that may be in contact with the cushion plate 300.

The cushion layer 320 having the shock-absorbing feature may reinforce rigidity of the cushion plate 300.

The adhesive layer 330 may be disposed on the cushion layer 320 and may be formed of a single layer having a certain thickness. Or, the adhesive layer 330 may include an uneven structure to be formed on a surface. Since the uneven structure of the adhesive layer 330 may prevent occurrence of air bubbles between the first plate 210 and the cushion plate 300 that may arise when the cushion plate 300 is attached to the first plate 210, a process to remove the air bubbles existing between the first plate 210 and the cushion plate 300 may be omitted.

The adhesive layer 330 includes an adhesive ingredient, and may fix the cushion plate 300 to the first plate 210 by being in direct contact with the first plate 210.

Below the cushion plate 300, a second connecting member 400 and a second plate 220 may be disposed.

The second connecting member 400 may be disposed between the cushion plate 300 and the pad part (PAD), or between the cushion plate 300 and the second plate 220. The second connecting member 400 may serve to fix the bent display panel 100 so as to maintain a bent form.

The second connecting member 400 may be formed to have a certain thickness along a thickness direction so that a curvature of the bending part (BND) can be maintained constantly. The second connecting member 400 may be a double-sided adhesive tape that can fix the second plate 220 and the heat dissipation layer 310 of the cushion plate 300, but is not limited thereto. In order to further improve a feature of absorbing shocks, the second connecting member 400 may be formed as an adhesive form tape or an adhesive foam pad.

Below the second connecting member 400, the second plate 220 may be disposed. In order to dispose and fix the second plate 220 below the second connecting member 400, the second plate 220 may be connected or attached at a rear surface of the pad part (PAD) of the display panel 100, and the second plate 220 may be attached or fixed to a rear surface of the second connecting member 400 by bending the bending part (BND).

In a state in which the second plate 220 is fixed to the second connecting member 400, the second plate 220 may have a structure disposed on the pad part (PAD). In other words, between the heat dissipation layer 310 of the cushion plate 300 and the pad part (PAD), the second connecting member 400 and the second plate 220 may be disposed.

With the second plate 220 fixed to the second connecting member 400, an exterior which is a top surface of the bending part (BND) is exposed to the outside, and a rear surface of the bending part (BND) which is an inside may be disposed to face each other with a side of the cushion plate 300 and a side of the second connecting member 400.

On the top surface which is the exterior of the bending part (BND) of the display panel 100, a reinforcing member 600 may be disposed. The reinforcing member 600 covers the bending part (BND) and may extend to cover the front part (FP) and an end portion of the pad part (PAD).

The reinforcing member 600 may include resin. For example, the reinforcing member 600 may include UV curable acryl resin, or thermoset resin, and various materials may be used as the reinforcing member 600 and is not limited thereto.

The reinforcing member 600 may be formed of a cured product of resin that went through a curing process after applying resin. If using UV curable resin, curing may be achieved through UV light irradiation. The reinforcing member 600 may be a Micro Cover Layer (MCL).

The reinforcing member 600 may cover various wirings of signals arranged between the encapsulation layer 130 of the display panel 100 and the pad part (PAD), thereby preventing the wirings of signals from permeation of moisture while protecting the wirings of signals from external shocks.

In the bending part (BND), since some components except the display substrate 110 and the wirings of signals may be omitted in order to improve flexibility of the display panel 100, rigidity may be deteriorated. The reinforcing member 600 may reinforce deteriorated rigidity of the bending part (BND) caused by the omission.

The bending part (BND) is a part disposed between the front part (FP) and the pad part (PAD), and may be bent so that the front part (FP) and the pad part (PAD) can be connected with each other and that the pad part (PAD) can be disposed below the front part (FP).

Since the bending part (BND), the pad part (PAD) and the like are disposed at a lower portion of the display panel 10 where the bending part (BND) is disposed, it is difficult to apply an antistatic coating 700 in a state the display panel 100 is bent.

Even in a state before the display panel 100 is not bent, the bending part (BND) is disposed between the cover member 20 and the cushion plate 300, therefore, it is difficult to apply the antistatic coating 700 sequentially from a rear surface of the cover member 20 to a rear surface of the cushion plate 300.

Thus, the antistatic coating 700 may be formed in certain areas at three portions (upper portion, left portion and right portion) at edges of the display apparatus 10 except the lower portion where the pad part (PAD) of the display panel 100 is disposed.

For example, the antistatic coating 700 may be formed in certain areas at three portions at edges of the cover member 20 and the cushion plate 300 illustrated in FIG. 1B, to take a circular or square shape which is about 4 mm wide and 20 mm long.

FIG. 3 is a sectional view taken along line II-II' of FIG. 1B. A structure of a sectional view of FIG. 3 may be similarly applied to a structure with three portions (upper portion, left portion and right portion) at edges of the display apparatus 10 except the lower portion where the pad part (PAD) of the display panel 100 is disposed.

At three portions (upper portion, left portion, right portion) at edges of the display apparatus 10 according to the aspect of the present disclosure, the cover member 20, the display panel 100 disposed below the cover member 20 and the cushion plate 300 disposed below the display panel 100 may be included.

The first connecting member 150 may be disposed optionally between the cover member 20 and the display panel 100, and the first plate 210 may be disposed optionally between the display panel 100 and the cushion plate 300.

The cushion plate 300 may include at least one among the heat dissipation layer 310, the cushion layer 320 and the adhesive layer 330, and may additionally include the anti-lifting layer (not illustrated). The antistatic coating 700 may be formed along a rear surface and a side surface of the cushion plate 300 and may be connected with a rear surface of the cover member 20.

In short, the antistatic coating 700 may be disposed sequentially from edges of a rear surface of the heat dissipation layer 310 through a side of the heat dissipation layer 310, a side of the cushion layer 320, a side of the adhesive layer 330, a side of the first plate 210, a side of the display panel 100, and a side of the first connecting member 150 to a rear surface of the cover member 20. If the cover member 20 includes the light blocking unit 21, the antistatic coating 700 may be disposed in the light blocking unit 21.

Since the components forming the cushion plate 300 may be added or omitted, the antistatic coating 700 may be disposed at sides, a top surface and/or bottom of the added component.

Further, since components such as the first connecting member 150 or the first plate 210 may be omitted and the antistatic coating 700 may not be disposed at sides of the omitted components, an arrangement of the antistatic coating 700 is not limited to a certain structure.

If components stacked from the display panel 100 to the cushion plate 300 are cut by the same trimming process, sides of components from the display panel 100 to the cushion plate 300 have no protruding spot. Therefore, the antistatic coating 700 may be disposed on sides only.

If a trimming process is not applied in a stacked structure encompassing from the display panel 100 to the cushion plate 300, each component has protruding areas on a side, therefore, the antistatic coating 700 may be disposed sequentially by wrapping the protruding areas.

Moreover, the first connecting member 150 that may be disposed between the cover member 20 and the display panel 100 includes a fluid substance such as an adhesive or resin, and if the first connecting member 150 goes over a side end of the cover member 20 or the display panel 100, the first connecting member 150 may permeate into other area by crossing a side of the cover member 20 or the display panel 100, thereby causing a defect in an appearance or a feature. Therefore, the first connecting member 150 may be disposed to be retracted inwardly between the cover member 20 and the display panel 100.

From a rear surface of the cover member 20 to a rear surface of the cushion plate 300, protruded parts and concave parts may be formed. In order to form the antistatic coating 700 successively in rugged surface such as the protruded parts and concave parts, the antistatic solution requires liquidity and viscosity above a certain level.

In addition, if the antistatic coating 700 is formed with a solution, the longer it takes to dry, the more likely to have a cut-off in the middle and a clumping in some area due to liquidity. Therefore, the antistatic coating should be dried in a short period of time, and may require high volatility. In the present disclosure, the antistatic solution may be understood as an antistatic coating 700.

Solvent of the antistatic solution may be formed by including at least one or more materials among acetone, water, isopropyl alcohol and ethanol, and a catalyst may be included additionally thereto. Solvent of the antistatic solution may be formed by blending one or more materials among the stated materials considering liquidity and volatility, depending on a side shape of the display apparatus 10.

Due to liquidity and viscosity above a certain level, the antistatic solution may be applied by dropping it quickly in a dotting manner in some areas and solvent may be removed by natural drying at temperature between 20 to 30 Celsius degree for 7 to 15 minutes to simplify the manufacturing process.

The antistatic solution includes a plurality of nanowires mixed with the solvent, and when the solvent of the antistatic solution is dried, a plurality of nanowires remain, and a plurality of nanowires may be connected to form the antistatic coating 700.

Figure 4A:
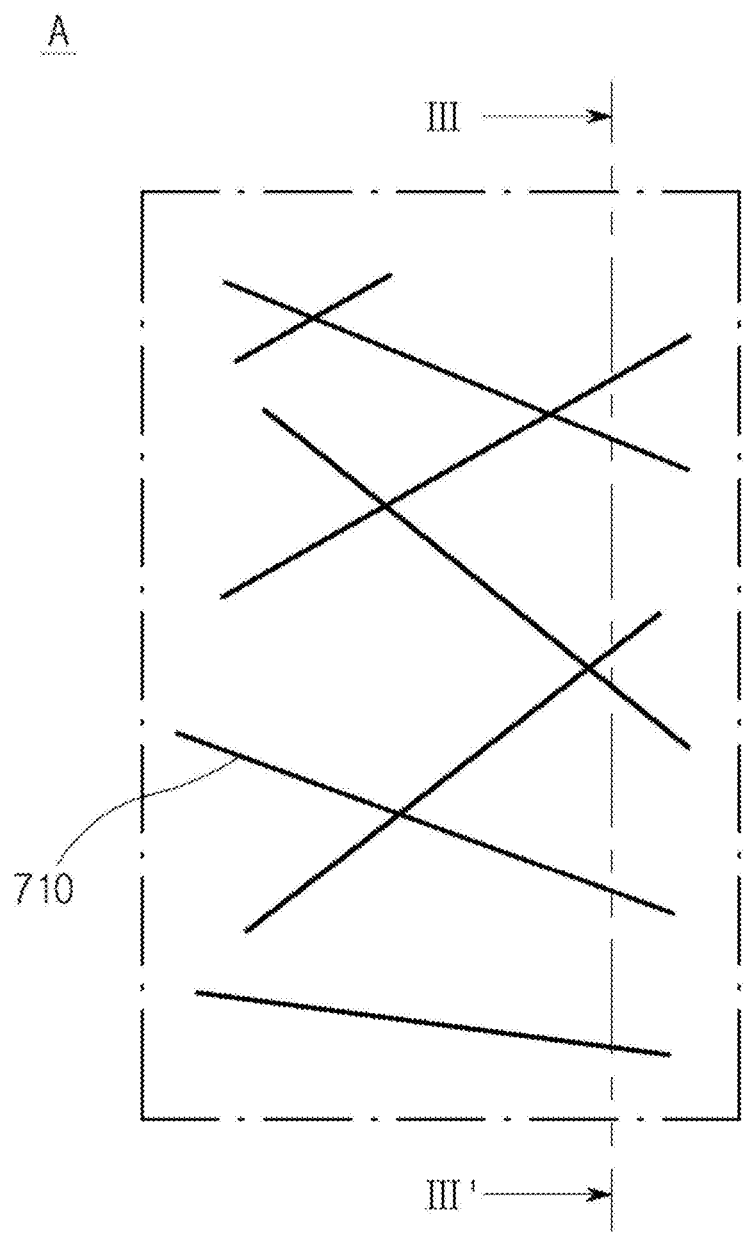
FIG. 4A is an enlarged plan view of the area "A" of FIG. 1B.
Figure 4B:
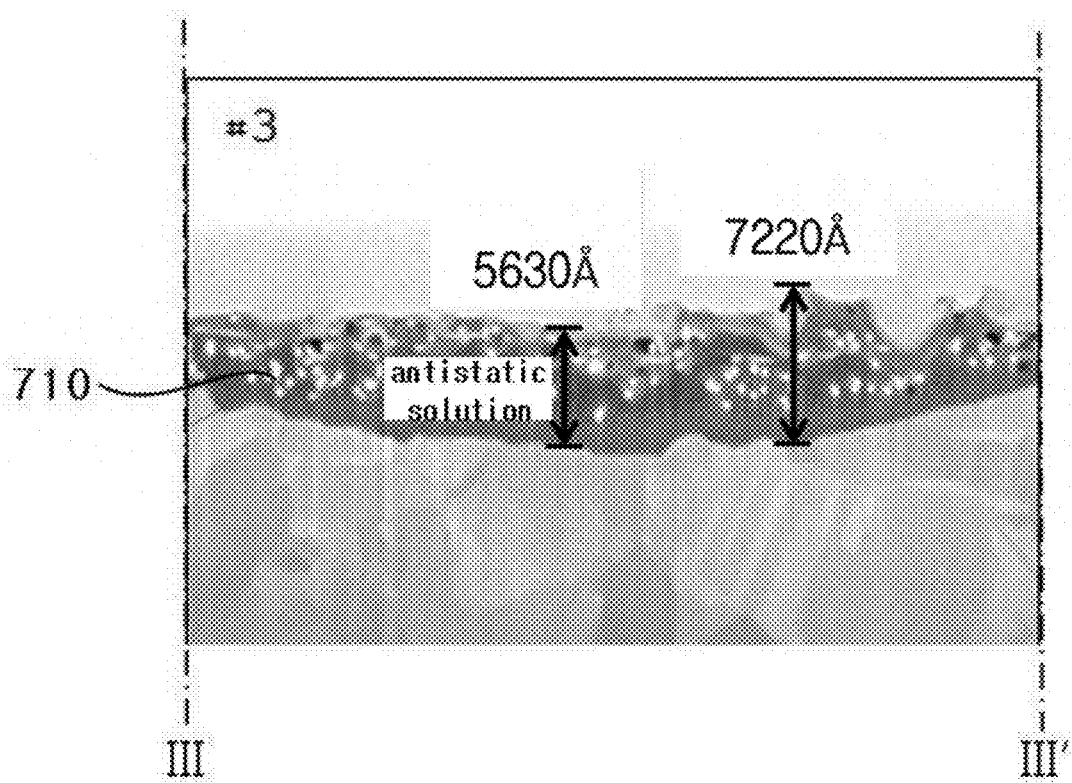
FIG. 4B is a cross-sectional view taken along a line of III-III' of FIG. 4A, illustrating a product applied with a plurality of nanowires.

FIG. 4A is an enlarged plan view of area "A" of FIG. 1B, and FIG. 4B is a cross-sectional view taken along a line of III-III' of FIG. 4A, illustrating a cross-section of the antistatic solution where a plurality of nanowires and solvent are mixed.

By referring to FIG. 4A, the antistatic coating 700 includes a plurality of nanowires 710. A plurality of nanowires 710 are disposed by being scattered and are connected to each other.

In order to form the antistatic coating 700 in which the nanowires 710 are connected and arranged, the solvent of the antistatic solution is dried, and a plurality of nanowires 710 are attached and connected to each other from the rear surface of the cushion plate 300 to the rear surface of the cover member 20.

A plurality of nanowires 710 mixed in the solvent are disposed by entirely being dispersed in the solvent, and in particular, are widely dispersed in the thickness direction of the solvent, so it may not be easy to connect a plurality of nanowires 710.

Therefore, it is possible to dry the solvent so that only a plurality of nanowires 710 remain. When the solvent is dried, a plurality of nanowires 710 may be densely disposed on a plane, thereby facilitating the connection between a plurality of nanowires 710.

The antistatic coating 700 having a certain thickness may be formed by using a curable resin as the solvent of the antistatic solution, but since the connection between a plurality of nanowires 710 dispersed in the thickness direction (Z-axis) of the antistatic coating 700 may be unsound, compared to the connection between a plurality of nanowires 710 disposed in a plane, it may have a cut-off spot where the connection is cut off.

Each of a plurality of nanowires 710 may be formed of at least one or more materials among silver (Ag), gold (Au), copper (Cu), and nickel (Ni), which has high electrical conductivity and workability in order to effectively transfer the electric charges or the electric fields. The material of the nanowires 710 is not limited thereto.

A plurality of nanowires 710 may have a circular, pentagonal, or polygonal rod shape in consideration of the connection structure and workability, and in consideration of the connection between a plurality of nanowires 710 and workability, the width or diameter is 20 to 30 nm, and the length may be 20 to 30 μm.

A plurality of nanowires 710 may be manufactured through extrusion processing, drawing processing, rolling, and the like, but the manufacturing method is not limited thereto.

A plurality of nanowires 710 have a rod shape, and even if clumping occurs in some areas, they are easy to be connected to each other, so that they can be continuously connected without cut-offs.

In addition, even if making the concentration of nanowires 710 in the antistatic solution be lower, it can be connected without cut-offs. For example, the concentration of the nanowires 710 in the antistatic solution may be formed to be 0.5 wt % or less, and a plurality of nanowires 710 may be continuously connected without cut-offs.

The nanowires 710 may have a bent rod shape with a portion bent at a predetermined angle in the middle so that the interconnected portions can be increased. The nanowires 710 may be bent in a plurality of areas depending on the parts and shapes to be connected, and the bending angle may also be formed in various ways depending on an applied area.

The antistatic coating 700 may dispose spherical conductive balls in addition to the nanowires 710. The spherical conductive balls may be disposed in the space between the nanowires 710, thereby improving the connectivity of the nanowires 710. In addition, since the connection areas are increased, the resistance may be lowered, and thus the transfer of electric charges or electric fields through the antistatic coating 700 may be improved.

The nanowires 710 of the antistatic coating 700 may be continuously disposed from a rear surface of the heat dissipation layer 310 of the cushion plate 300 to the rear surface of the cover member 20 along sides of the cushion plate 300 and the display panel 100.

The nanowires 710 may be continuously connected without cut-offs, and grooves may be formed on a rear surface of the heat dissipation layer 310 to efficiently connect a plurality of nanowires 710.

Figure 5A:
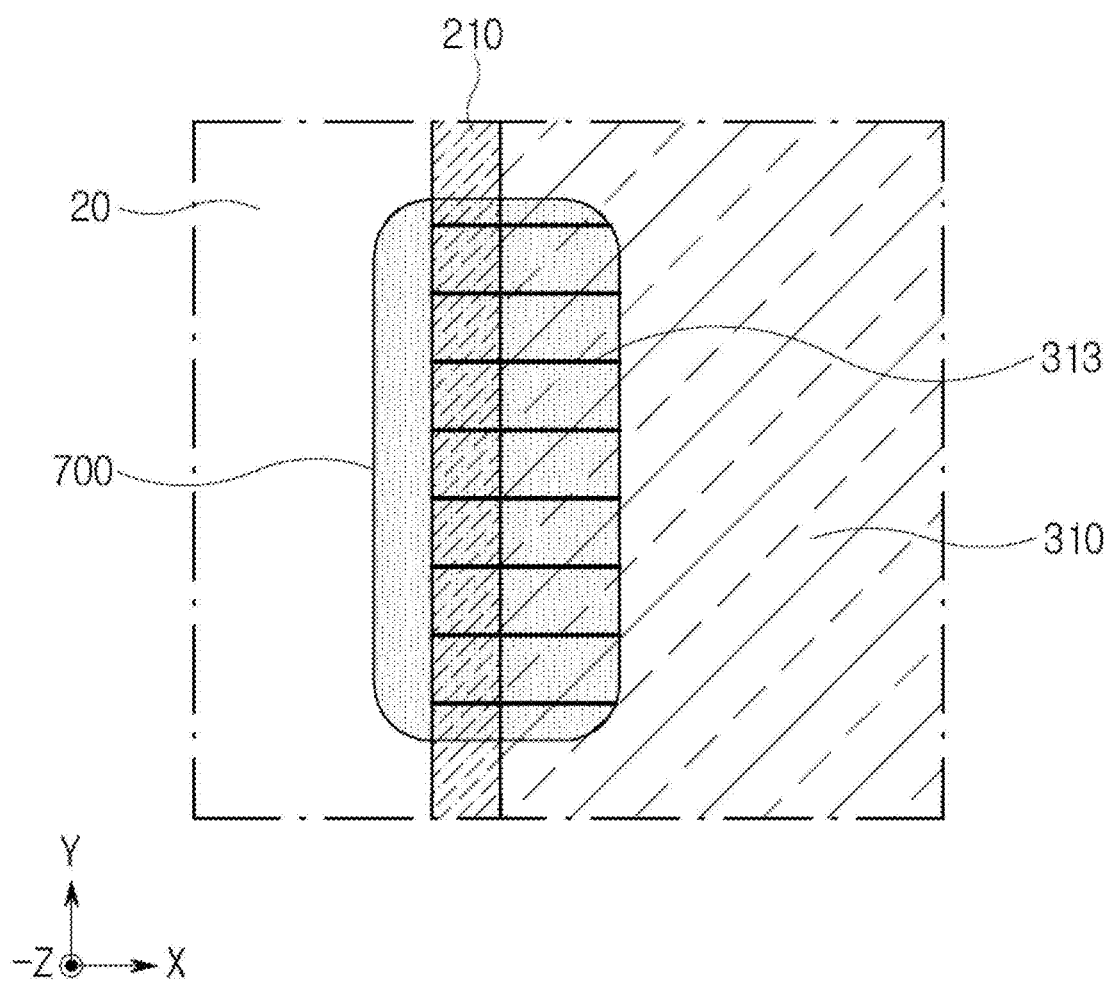
FIG. 5A is an enlarged plan view of the area "B" of FIG. 1B, illustrating a horizontal line pattern according to an aspect of the present disclosure.

FIG. 5A is an enlarged plan view of the area "B" of FIG. 1B, illustrating a horizontal line pattern according to an aspect of the present disclosure.

Referring to FIG. 5A, the antistatic coating 700 may be formed from a rear surface of the heat dissipation layer 310 of the cushion plate 300 to a rear surface of the cover member 20. That is, the antistatic coating 700 may be formed with a plurality of nanowires connected from the rear surface of the heat dissipation layer 310 to the rear surface of the cover member 20.

The nanowires are not arranged in a regular direction, but randomly arranged along various directions. In order to control the arrangement direction of the nanowires, the horizontal line pattern 313 engraved with a number of grooves may be formed on the cushion plate 300. The horizontal line pattern 313 may extend from the cover member 20 to the heat dissipation layer 310 and may mean grooves formed in the horizontal direction, which is an X-axis direction of the display panel 100.

The horizontal line pattern 313 may be formed over the entire area of the cushion plate 300, or may be formed only on an area where the antistatic coating 700 is to be formed. If forming the horizontal line pattern 313 only on an area where the antistatic coating 700 is to be formed, it is possible to prevent the antistatic solution from spreading to other areas.

The cushion plate 300 in which the horizontal line pattern 313 is formed may include the cushion layer 320 and the heat dissipation layer 310 disposed below the cushion layer 320, and the horizontal line pattern 313 engraved with grooves along the horizontal direction (X-axis) may be formed on the rear surface of the cover member 20 or the rear surface of the heat dissipation layer 310. The horizontal line pattern 313 may also be formed on the first plate 210. In addition, if the cover member 20 includes the light blocking unit, the horizontal line pattern 313 may be formed on the light blocking unit as well.

The horizontal line pattern 313 is formed with intaglio-shaped grooves, and the cross-section may be formed in a semicircular shape, a square shape, a triangular shape and the like, and the shape of the groove is not limited thereto.

When the antistatic solution is applied to the first plate 210 or heat dissipation layer 310 to form the antistatic coating 700, the antistatic solution flows into the horizontal line pattern 313, and by the grooves of the horizontal line pattern 313, the nanowires may be aligned.

Since the same amount of the antistatic solution may be filled in each of a plurality of horizontal line patterns 310, concentration of the antistatic solution formed in a certain area may be alleviated, and the clumping of the nanowires may be improved.

In addition, in the process of drying the antistatic solution, the nanowires are concentrated to the bottom of the horizontal line pattern 313, so a plurality of nanowires are stacked and connected along the horizontal line pattern 313, the resistance gets lowered, and the electric charges or the electric fields may be effectively transferred to the heat dissipation layer 310 and then be dispersed.

That is, the horizontal line pattern 313 may be formed along a travel path of the electric charges or the electric fields, and may be arranged to improve transfer of the electric charges or the electric fields formed on a side surface of the cover member 20 and/or the display panel 100.

Figure 5B:
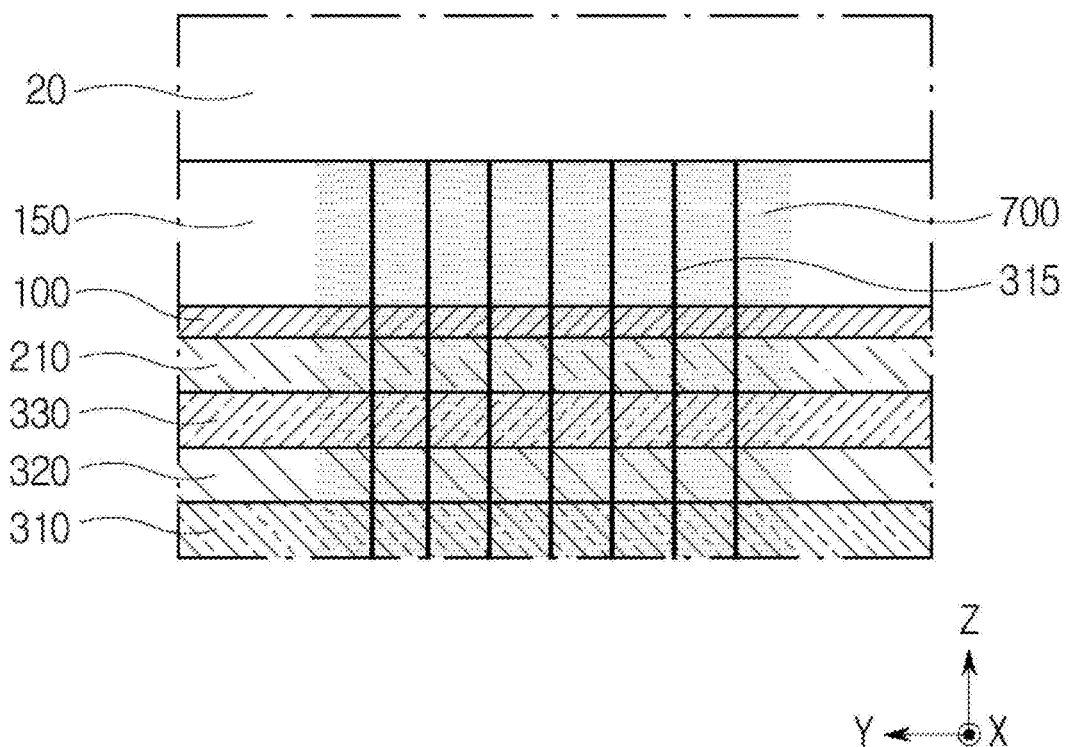
FIG. 5B is a side view of the display apparatus of FIG. 3, illustrating a lateral horizontal line pattern according to an aspect of the present disclosure.

FIG. 5B is a side view of the display apparatus of FIG. 3, illustrating a lateral pattern according to an aspect of the present disclosure.

In other words, FIG. 5B is a side view of the area on which the antistatic coating 700 of the display apparatus 10 in FIG. 3 is disposed as viewed from the X-axis direction.

Referring to FIG. 5B, a lateral horizontal line pattern 315 engraved with a number of grooves along the thickness direction (Z-axis) of the display apparatus 10 may be formed on the side of the display apparatus 10 on which the antistatic coating 700 is formed.

On the upper portion, the right portion, and the left portion of the display apparatus 10, the cover member 20, the display panel 100, the first plate 210, and the cushion plate 300 may be disposed and the lateral horizontal line pattern 315 may be sequentially formed on sides of the display panel 100, the first plate 210, and the cushion plate 300.

That is, on the side surface of the display panel 100 and the side surface of the cushion plate 300, the lateral horizontal line pattern 315 engraved along the thickness direction (Z-axis) of the display apparatus 10 may be formed.

When the first connecting member 150 is disposed on a top surface of the display panel 100, the lateral horizontal line pattern 315 may be formed on a side of the first connecting member 150 as well.

The lateral horizontal line pattern 315 is connected to the horizontal line pattern 313, and the lateral horizontal line pattern 315 and the horizontal line pattern 313 may be sequentially formed.

The lateral horizontal line pattern 315 is formed with intaglio-shaped grooves, and the cross-section may be formed in a semicircular shape, a square shape, a triangular shape and the like, and the shape of the groove is not limited thereto.

When the antistatic solution is applied to the first plate 210 or the heat dissipation layer 310 to form the antistatic coating 700, the antistatic solution flows down and flows into the lateral horizontal line pattern 315, so that the nanowires may be aligned according to the lateral horizontal line pattern 315.

In addition, if applying the antistatic solution by making the display apparatus 10 be rotated and the lateral horizontal line pattern 315 be disposed to face upward, the antistatic solution can be evenly formed over the entire area of the lateral horizontal line pattern 315, thereby preventing clumping. By doing so, the electric charges or the electric fields can be effectively transferred from the side of the cover member 20 and/or the side of the display panel 100 to the heat dissipation layer 310.

That is, the antistatic solution may be sequentially disposed from the horizontal line pattern 313 through the lateral horizontal line pattern 315 to the cover member 20 to form the antistatic coating 700, and the nanowires included in the antistatic coating 700 may be arranged sequentially from the horizontal line pattern 313 to the lateral horizontal line pattern 315.

Figure 6A:
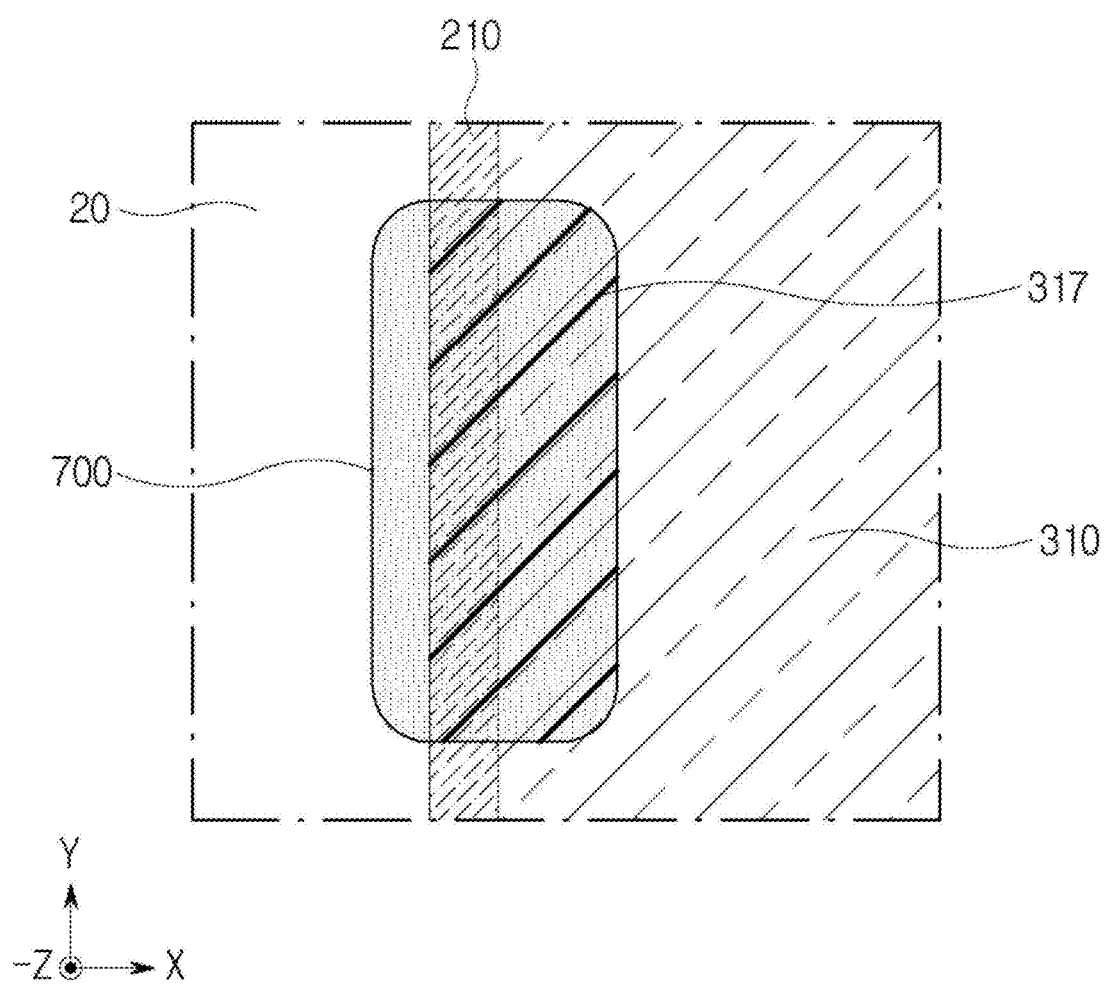
FIG. 6A is an enlarged plan view of area "B" of FIG. 1B, illustrating a diagonal line pattern according to another aspect of the present disclosure.

FIG. 6A is an enlarged plan view of the area "B" of FIG. 1B, illustrating a diagonal line pattern according to another aspect.

Referring to FIG. 6A, a diagonal line pattern 317 may be formed on at least one among the heat dissipation layer 310, the first plate 210, and the cover member 20.

The cushion plate 300 includes the cushion layer 320 and the heat dissipation layer 310 disposed below the cushion layer 320. On the rear surface of the cover member 20 or the rear surface of the heat dissipation layer 310, a diagonal line pattern 317 engraved with a number of grooves in a diagonal direction that is between the X-axis and the Y-axis of the display panel 100 may be formed.

When the cover member 20 includes the light blocking unit, the diagonal line pattern 317 may also be formed on the light blocking unit.

The diagonal line pattern 317 may be formed as an engraved groove in the same manner as the horizontal line pattern 313 of FIG. 5A.

The nanowires of the antistatic coating 700 may be diagonally aligned by the diagonal line pattern 317. When the nanowires are aligned in the diagonal direction, an area occupied by the nanowires becomes larger than an area occupied by the nanowires aligned in the horizontal direction, so the area where the nanowires having excellent conductivity are arranged increases, the resistance gets lower, and the electric charges or the electric fields can be effectively transferred.

In addition, when the antistatic solution is dropped on a plurality of the diagonal line patterns 317, the antistatic solution may be evenly spread on an entire area along the diagonal line pattern.

The diagonal line pattern 317 may be formed on the entire area of the rear surface of the heat dissipation layer 310 or the rear surface of the cover member 20, or may be formed only on an area where the antistatic coating 700 is intended to be formed. When the diagonal line pattern 317 is formed only on an area where the antistatic coating 700 is intended to be formed, it is possible to prevent the antistatic solution from spreading to other areas.

Figure 6B:
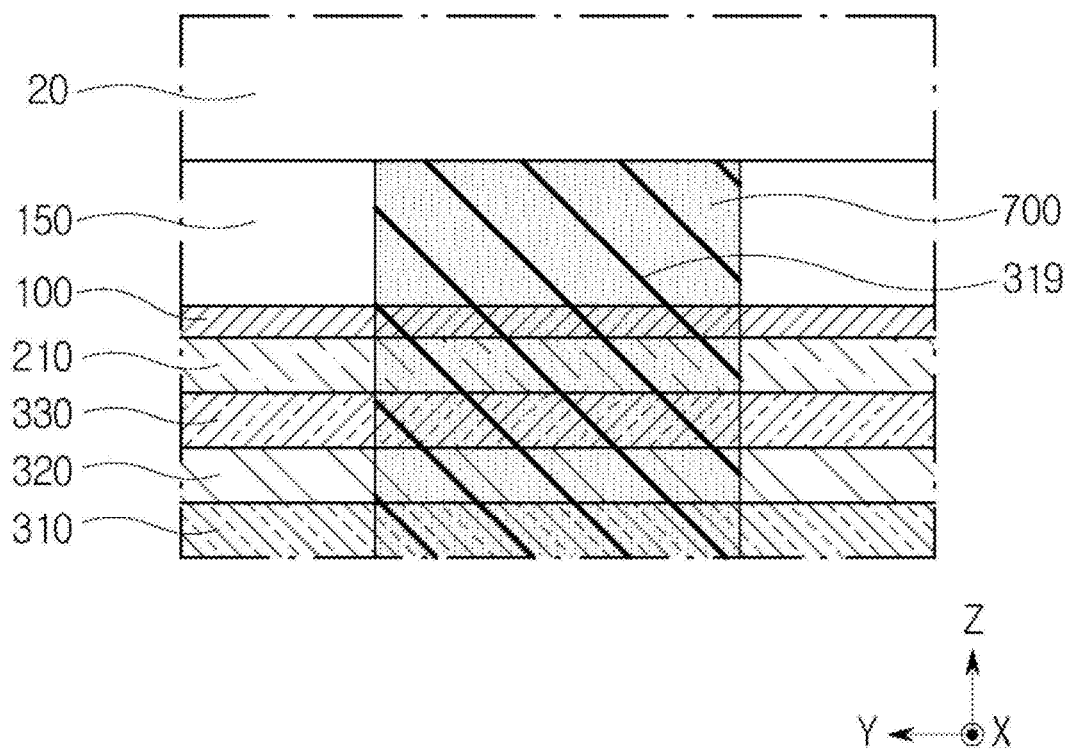
FIG. 6B is a side view of the display apparatus of FIG. 3, illustrating a lateral diagonal line pattern according to another aspect of the present disclosure.

FIG. 6B is a side view of the display apparatus of FIG. 3, illustrating a lateral diagonal line pattern according to another aspect.

That is, FIG. 6B is a side view of the area on which the antistatic coating 700 of the display apparatus 10 of FIG. 3 is disposed as viewed from the X-axis direction.

Referring to FIG. 6B, on the side surface of the display apparatus 10 on which the antistatic coating 700 is formed, the lateral diagonal line pattern 319 engraved with a number of grooves along the diagonal direction of the thickness direction, which is a direction between the Z-axis and Y-axis of the display apparatus 10, may be formed. That is, the lateral diagonal line pattern 319 engraved with a number of grooves along a diagonal direction of the thickness direction (between the Z-axis and Y-axis) may be formed on the side surface of the display panel 100 and the side surface of the cushion plate 300.

The lateral diagonal line pattern 319 may be formed with intaglio-shaped grooves in the same manner as the lateral horizontal line pattern 317 of FIG. 6A. The lateral diagonal line pattern 319 may be connected to the diagonal line pattern 317, and the diagonal line pattern 317 and the lateral diagonal line pattern 319 may be sequentially formed.

When the antistatic solution is dropped on the lateral diagonal line pattern 319 to form the antistatic coating 700, the flow rate of the antistatic solution may be slow because the grooves are formed in a diagonal direction.

As the antistatic solution stays on the lateral diagonal line pattern 319 for a longer time, a plurality of nanowires disposed on the lateral diagonal line pattern 319 may be increased. In addition, by adjusting the angle of the diagonal direction, the nanowires may be evenly arranged from the upper portion to the lower portion on the side of the display apparatus 10.

Therefore, the resistance of the antistatic coating 700 formed on the side surface of the display apparatus 10 can be lowered, and the electric charges and the electric fields can be effectively transferred from the side surface of the cover member 20 and/or the display panel 100 to the heat dissipation layer 310.

As another aspect of the present disclosure, the antistatic coating 700 may be applied to a product using a porous member to serve as the cushion plate.

For example, the cushion plate may include a porous member which is a conductive metal having a plurality of pores inside, and an adhesive layer disposed on the porous member, and the antistatic coating may be applied sequentially to a rear surface and a side surface of the porous member, a side surface of the adhesive layer, a side surface of the display panel, and a rear surface of the cover member.

When the first plate is disposed between the display panel and the porous member, the porous member may also be disposed on a side of the first plate.

In addition, when the first connecting member is disposed between the cover member and the display panel, the porous member may also be disposed on a side of the first connecting member.

Since the porous member has a plurality of pores, it may be difficult to dispose the antistatic solution, and thus a metal layer such as a metal foil may be additionally disposed on a portion of the porous member on which the antistatic coating is to be disposed.

The display apparatus according to the present disclosure may be described as follows.

A display apparatus according to the present disclosure comprises a display panel configured to display images; a cover member configured to be disposed upon the display panel and protect the display panel from external shocks; a cushion plate configured to be disposed below the display panel and have features of cushioning and heat dissipation; an antistatic coating configured to extend and disposed from the cover member to the cushion plate; wherein the antistatic coating comprises a plurality of nanowires.

According to some aspects of the present disclosure, a plurality of nanowires have a shape of a circular or a polygonal rod and are formed of at least one or more materials among silver (Ag), copper (Cu) and nickel (Ni).

According to some aspects of the present disclosure, a plurality of nanowires may have a bent rod shape.

According to some aspects of the present disclosure, the antistatic coating is disposed with a plurality of nanowires connected from the cover member to the cushion plate.

According to some aspects of the present disclosure, the antistatic coating further comprises a plurality of conductive balls.

According to some aspects of the present disclosure, the cushion plate comprises a cushion layer and heat dissipation layer disposed below the cushion layer, and a rear surface of the cover member or a rear surface of the heat dissipation layer may have the horizontal line pattern engraved with a number of grooves along a horizontal direction (X-axis) of the display panel, or the diagonal line pattern engraved with a number of grooves along a diagonal direction (between X-axis and Y-axis).

According to some aspects of the present disclosure, a side of the display panel and a side of the cushion plate may have the lateral horizontal line pattern engraved with a number of grooves along a thickness direction (Z-axis) or the lateral diagonal line pattern engraved with a number of grooves along diagonal direction of the thickness direction (between Z-axis and Y-axis).

According to some aspects of the present disclosure, a plurality of nanowires may be disposed in the grooves of the horizontal line pattern, the diagonal line pattern, the lateral horizontal line pattern, or the lateral diagonal line pattern.

According to some aspects of the present disclosure, the display apparatus further comprises the first connecting member connecting the display panel and the cover member and the antistatic coating may be disposed sequentially on a rear surface of the cover member, a side of the first connecting member, a side of the display panel, a side and a rear surface of the cushion plate.

According to some aspects of the present disclosure, the display apparatus further comprises the first connecting member connecting the display panel and the cover member, wherein the antistatic coating may be disposed sequentially on a rear surface of the cover member, a side surface of the first connecting member, a side surface of the display panel, a side surface and a rear surface of the cushion plate.

According to some aspects of the present disclosure, the cushion plate may comprise the porous member including a conductive metal and a plurality of pores disposed inside the conductive metal and the adhesive layer disposed on the porous member.

A method of disposing the antistatic solution according to some aspects of the present disclosure comprises forming the antistatic solution by mixing the nanowires with a solvent including at least one or more materials among acetone, water, isopropyl alcohol and ethanol and applying the antistatic solution in the display apparatus and drying the antistatic solution.

According to some aspects of the present disclosure, the drying of the antistatic solution is a natural drying at temperature between 20 to 30 Celsius degree for 7 to 15 minutes.

Described above are description of aspects of the present disclosure with reference to the accompanying drawings. However, it would be understood that the present disclosure is not limited by the aspects described herein and may be implemented in many different forms without departing from the technical concept thereof. Thus, the aspects set forth hereinabove are examples to explain the technical concept, and do not limit the scope of the technical concept of the present disclosure. Therefore, it should be understood that the aspects set forth hereinabove are exemplary and are not limitative. The protective scope of the present disclosure should be construed based on the following claims, and all the technical concepts in the equivalent scope of the claims should be construed as falling within the scope of the present disclosure.

What is claimed is:

1. A display apparatus comprising:
a display panel configured to display images;
a cover member disposed upon the display panel and protecting the display panel from external shocks;
a cushion plate disposed below the display panel and providing cushioning and heat dissipation for the display panel; and
an antistatic coating extended from the cover member to the cushion plate and comprising a plurality of nanowires,
wherein the antistatic coating is in direct contact with a side of the display panel and a side of the cushion plate, and wherein at least one of a rear surface of the cover member and a rear surface of the heat dissipation layer has a horizontal line pattern engraved with a number of grooves along a horizontal direction corresponding to an X-axis direction of the display panel.

2. The display apparatus of claim 1, wherein the plurality of nanowires have a shape of a circular or a polygonal rod and are formed of at least one or more materials of silver (Ag), copper (Cu) and nickel (Ni).

3. The display apparatus of claim 2, wherein the plurality of nanowires have a bent rod shape.

4. The display apparatus of claim 1, wherein the antistatic coating is disposed with a plurality of nanowires connected from the cover member to the cushion plate.

5. The display apparatus of claim 1, wherein the antistatic coating further comprises a plurality of conductive balls.

6. The display apparatus of claim 1, wherein the cushion plate comprises a cushion layer and a heat dissipation layer disposed below the cushion layer.

7. The display apparatus of claim 6, wherein at least one of a rear surface of the cover member and a rear surface of the heat dissipation layer has a diagonal line pattern engraved with a number of grooves along a diagonal direction between X-axis and Y-axis of the display panel.

8. The display apparatus of claim 7, wherein the plurality of nanowires are disposed in the grooves of the horizontal line pattern or the diagonal line pattern.

9. The display apparatus of claim 1, wherein at least one of a side of the display panel and a side of the cushion plate has a lateral horizontal line pattern engraved with a number of grooves along a thickness direction corresponding to a Z-axis direction of the display panel, or a lateral diagonal line pattern engraved with a number of grooves along a diagonal direction of a thickness direction between the Z-axis and a Y-axis of the display panel.

10. The display apparatus of claim 6, wherein the plurality of nanowires are disposed in the grooves of the lateral horizontal line pattern, or the lateral diagonal line pattern.

11. The display apparatus of claim 1, further comprising a first connecting member connecting the display panel and the cover member.

12. The display apparatus of claim 11, wherein the antistatic coating is disposed sequentially on a rear surface of the cover member, a side surface of the first connecting member, a side surface of the display panel, a side surface and a rear surface of the cushion plate.

13. The display apparatus of claim 1, wherein the cushion plate comprises:
    a porous member comprising a conductive metal and a plurality of pores disposed inside the conductive metal; and
    an adhesive layer disposed on the porous member.

14. A method of disposing an antistatic coating, the method comprising:
    forming an antistatic solution by mixing nanowires with a solvent comprising at least one or more materials of acetone, water, isopropyl alcohol and ethanol;
    applying the antistatic solution in a display apparatus; and
    drying the antistatic solution,
    wherein the display apparatus comprises:
    a display panel configured to display images; and
    a cushion plate disposed below the display panel and providing cushioning and heat dissipation for the display panel,
    the antistatic solution is applied directly to a side of the display panel and a side of the cushion plate,
    wherein at least one of a rear surface of the cover member and a rear surface of the heat dissipation layer has a horizontal line pattern engraved with a number of grooves along a horizonal direction corresponding to an X-axis direction of the display panel.

15. The method of claim 14, wherein the drying of the antistatic solution including a drying at temperature between 20 to 30 Celsius degree for 7 to 15 minutes.

* * * * *